United States Patent [19]
Jones et al.

[11] Patent Number: 5,666,288
[45] Date of Patent: Sep. 9, 1997

[54] METHOD AND APPARATUS FOR DESIGNING AN INTEGRATED CIRCUIT

[75] Inventors: Larry G. Jones; David T. Blaauw; Robert L. Maziasz; Mohan Guruswamy, all of Austin, Tex.

[73] Assignee: Motorola, Inc., Schaumburg, Ill.

[21] Appl. No.: 426,211

[22] Filed: Apr. 21, 1995

[51] Int. Cl.$^6$ .................................................. G06F 17/50
[52] U.S. Cl. ........................... 364/490; 364/489; 364/491
[58] Field of Search ....................................... 364/488, 489, 364/490, 491, 578

[56] References Cited

U.S. PATENT DOCUMENTS

| | | | |
|---|---|---|---|
| 4,613,940 | 9/1986 | Shenton et al. | 364/490 |
| 4,813,013 | 3/1989 | Dunn | 364/900 |
| 5,084,824 | 1/1992 | Lam et al. | 364/490 |
| 5,258,919 | 11/1993 | Yamanouchi et al. | 364/489 |
| 5,274,568 | 12/1993 | Blinne et al. | 364/489 |
| 5,406,497 | 4/1995 | Altheimer et al. | 364/489 |
| 5,452,227 | 9/1995 | Kelsey et al. | 364/489 |
| 5,459,673 | 10/1995 | Carmean et al. | 364/489 |
| 5,487,018 | 1/1996 | Loos et al. | 364/489 |
| 5,493,508 | 2/1996 | Dangelo et al. | 364/489 |
| 5,510,998 | 4/1996 | Woodruff et al. | 364/489 |
| 5,519,627 | 5/1996 | Mahmood et al. | 364/488 |
| 5,572,436 | 11/1996 | Dangelo et al. | 364/489 |
| 5,572,437 | 11/1996 | Rostoker et al. | 364/489 |

OTHER PUBLICATIONS

S. Sapattnekar, V. Rao and P. Vaidya, "A Convex Optimization Approach to Transistor Sizing for CMOS Circuits," ICCAD–91, Nov. 11–14, 1991, Santa Clara, CA pp. 482–485.

D. Hill, D. Shugard, A. Dunlop, J. Fishburn, "A Set of Switch–Level Synthesis Tools," 1990 IEEE Intl. Symposium on Circuits and Sytems, vol. 4., pp. 2571–2575.

A. Dunlop, J. Fishburn, D. Hill, D. Shugard, "Experiments Using Automatic Physical Design Techniques for Optimizing Circuit Performance," Intl. Symp. on Circuits & Systems, 1990, pp. 847–851.

Dwight Hill, "SC2D: A Broad–Spectrum Automatic Layout System," IEEE 1987 Custom Integrated Circuits Conference, May 4–7, pp. 729–732.

J. Shyu, J. Fishburn, A. Dunlop, A. Santiovanni–Vincentelli, "Optimization–Based Transistor Sizing," IEEE 1987 Custom Integrated Circuits Conference, May 4–7, pp. 417–420.

J. Fishburn,, A Dunlop, "TILOS: A Posynomial Programming Approach to Transistor Sizing," IEEE Intl. Conference on Computer Aided–Diesign, 1985, pp. 328–328.

N. Maheshwari, S. Sapatnekar, "Gate Size Optimization for Row–based Layouts," 38th Midwest Symposium on Circuits and Systems, vol. 2, pp. 777–779, 1996.

Lee et al., "A Graphic Interface for Power System Simulation," 1993 Power Industry Computer Application Conference, pp. 269–276.

Ramachandran et al., "SYMCELL–A Symbolic Standard Cell System," IEEE Journal of Solid–State Circuits, vol. 23, No. 3, Mar. 1991, pp. 449–452.

*Primary Examiner*—Kevin J. Teska
*Assistant Examiner*—Leigh Marie Garbowski
*Attorney, Agent, or Firm*—Keith E. Witek

[57] ABSTRACT

A method and apparatus for designing and manufacturing integrated circuits (ICs) involves providing an initial library of IC cells (106) and a behavioral circuit model (100) in order to create a gate schematic netlist (102). The gate schematic netlist (102) is optimized by changing individual transistor sizes, power rail sizes, cell pitch, and the like in a step (103). Once the optimization has occurred, the initial library can no longer be used to place and route the IC. Therefore, a hybrid logic cell library is created from the gate schematic netlist (102) via a step (105). This hybrid library and the above optimizations provides a placed and routed IC via a step (126) in a short design cycle while optimizing performance of the IC.

40 Claims, 7 Drawing Sheets

METHOD AND APPARATUS FOR DESIGNING AN INTEGRATED CIRCUIT

FIELD OF THE INVENTION

The present invention relates generally to data processing systems, and more particularly, to methods for designing an integrated circuit.

BACKGROUND OF THE INVENTION

Figure 1:
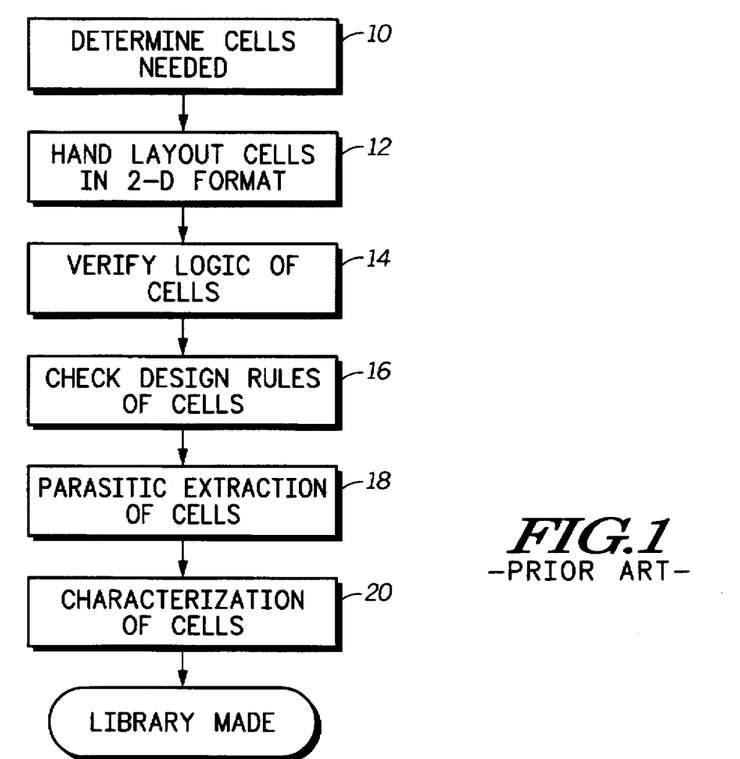
FIG. 1 illustrates, in a flowchart, a prior art method for forming a library of logic cells.

In order to design an integrated circuit (IC), an integrated circuit designer must first provide a library of computer stored circuit cells and a behavioral circuit model describing the functionality of the integrated circuit. FIG. 1 illustrates a widely used and well known method for generating a library of computer stored logic cells. First, the integrated circuit designer needs to determine what cells are needed for the integrated circuit via a step 10. In this step, the human IC designer makes a human determination as to what logic cells are need to manufacture an integrated circuit. These cells typically include fundamental logic gates such as OR, NAND, NOR, AND, XOR, inverter, and like logic cells with an array of logic gate sizes. Once all the required cells are determined via step 10, a step 12 is performed. In the step 12, the IC designer hand-lays out the cells determined in step 10 via a computer graphical interface. In other words, the integrated circuit designer determines physical placement of transistors within each logic cell and determines conductive routing between electrodes of the transistors to form the required logic gates. Once this placing is determined by the human IC designer, the IC designer uses the graphical interface to enter these human determined positions into a computer data base in a two-dimensional format.

Step 14 in FIG. 1 is then used to verify the logic cells defined by the IC designer in step 12. In many cases, Step 14 will discover that the IC designer improperly connected or improperly placed a physical item within one or more cells. In this case, these errors are flagged to the IC designer so that the layout cells may be fixed so that the layout cells perform their proper logical operation. After the step 14, a step 16 checks the hand-laid-out cells to determine if a plurality of design rules are adhered to. Design rules are provided to integrated circuit designers to ensure that a part can be manufactured with greater yield. Most design rules include hundreds of parameters and, for example, include pitch between metal lines, spacing between diffusion regions in the substrate, sizes of conductive regions to ensure proper contacting without electrical short circuiting, minimum widths of conductive regions, pad sizes, and the like. If in step 16 a design rules violation is identified, this violation is flagged to the IC designer so that the IC designer can properly correct the cells so that the cells are in accordance with the design rules. After step 16, a step 18 is performed. In step 18, device physics parasitics are extracted from each of the library cells generated in steps 10–16 by the human IC designer. Parasitic quantities extracted include resistances, capacitances, impedances, inductance, and other like parameters which physically affect or are physically brought about by the cells designed in steps 10–16. In a step 20, the parameters extracted from step 18 along with the physical two dimensional layout of cells defined in steps 10–16 is used to characterize the cells for use in integrated circuit design. When designing an integrated circuit, it is important to take into account characterizations of the cells in order to ensure a functional integrated circuit. The characterizations are found in step 20 and typically include signal rise time, signal fall time, power consumption, propagation delay times though the device, area of the cell, skew rates, and other parameters which may be applicable to the logic cells. Once steps 10–20 have been performed, a library of unconnected cells having inputs and outputs have been adequately formed for use in integrated circuit design. The cells are used as building blocks which are pieced together into a larger interconnected cell-structure known as an integrated circuit.

Figure 2:
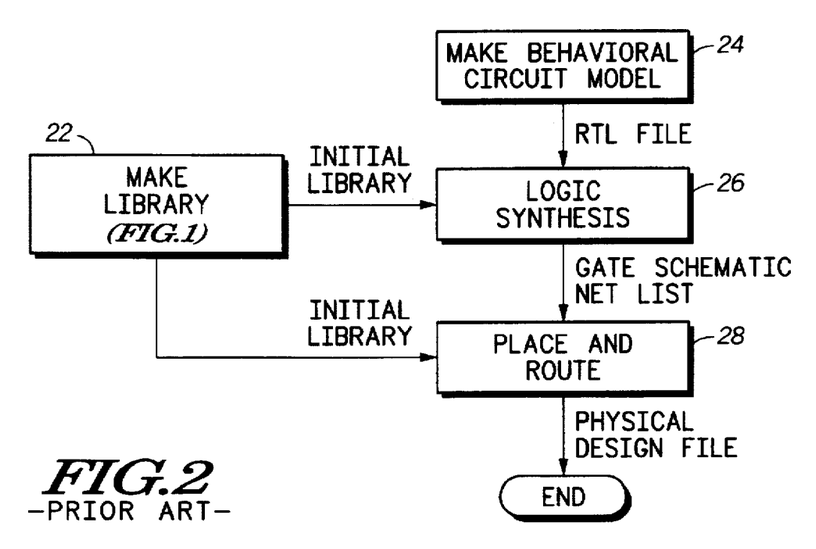
FIG. 2 illustrates, in a flowchart, a prior art method for using the library cells to form an integrated circuit.

Once a library is formed via FIG. 1, the library is used in a step 22 of FIG. 2 to design an integrated circuit from the cells defined in FIG. 1. The human IC designer presents as input to a logic synthesis tool 26, the library of cells from step 22 (see FIG. 1) a behavioral model from step 24 in FIG. 2. The library of cells of step 22 was discussed in detail in FIG. 1. The behavioral circuit model is typically a file in memory which looks very similar to a computer program. The behavioral circuit model contains instructions which define logically the operation of the integrated circuit. The logic synthesis tool of step 26, receives as input the instructions from the behavioral circuit model and the library cells from the library in step 22. The synthesis tool 26 maps the instructions from the behavioral circuit model to one or more logic cells from the library to transform the behavioral circuit model to a gate schematic net list of interconnected cells. A gate schematic net list is a data base having interconnected logic cells which perform a logical function in accordance with the behavioral circuit model instructions. In the prior art, once the gate schematic net list is formed, it is provided to a place and route tool via a step 28.

Even though the gate schematic net list contains the initial library cells interconnected into a data base to function in a manner analogous to the behavioral circuit model, the gate schematic net list does not indicate physical placement of cells on an integrated circuit substrate or dye. In other words, the cells in the gate schematic net lists are not physically positioned with respect to one another. The place and route tool of step 28 is used to access the gate schematic net list and the library cells of step 22 to position the cells of the gate schematic net list in a two-dimensional format within a surface area of an integrated circuit die perimeter. The output of the place and route step 28 is a two-dimensional physical design file which indicates the layout interconnection and two-dimensional IC physical arrangements of all gates/cells within the gate schematic net list.

One problem with the widely used process illustrated in FIG. 2 is that the library (step 22 and FIG. 1) is created and defined in a static manner before the process of steps 26 and 28 are performed. The library is never changed after the step 22 and is not customized for the integrated circuit as steps 26 and 28 precede. For this reason, the IC designers are limited to the logic gates implemented in step 22 when performing steps 26 and 28 regardless of whether these cells are appropriate or not. This results in an integrated circuit having time delay problems, power consumption problems, surface area problems, and yield reduction due to static and unchanging library cell availability. These libraries are difficult to create and it is typical that a single library may be used to design multiple ICs and thereby incorporate the above problems into many ICs within a family of products. Therefore, the need exists for a design process which is more interactive in terms of further defining and manipulating library cells throughout the entire design process.

BRIEF DESCRIPTION OF THE DRAWINGS

PIG. 8 illustrates a transistor level diagram of the gates of FIG. 7.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

In general, the present invention teaches a method and apparatus for designing an integrated circuit. The design process and apparatus taught herein begins by providing a behavioral model and an initial library of logic cells to a design synthesis tool. The design synthesis tool (such as Synopsis® design compiler) processes the behavioral model using initial library cells to provide a gate schematic net list. The gate schematic net list is a plurality of interconnected library cells stored in a data file which when functionally tested will perform the required IC logic functions in accordance with the IC behavioral model. The gate schematic net list is then processed to redefine boundaries of logic cells. In addition, cell strengths are altered by altering specific sizes of transistors in the gate schematic net list. This size alteration is used to achieve speed path constraints while minimizing area (die size/footprint) or power impact. Power rail conductors (conductive lines which supply Vdd and ground voltages to the logic cells) are changed in width in order to ensure proper supply of current and voltage so that power inadequacies do not occur in the integrated circuit. Also, cell pitch or cell height of various blocks of circuitry in the gate schematic net list are optimized in order to ensure minimal area and optimized integrated circuit layout.

Once these optimizations are performed to the gate schematic net list the initial set of library cells can no longer be used to form the integrated circuit since transistors have been changed in physical characteristics from the initial library and the outer boundary of what defines the particular logic cells have been changed from the initial library cell entries. These changes resulted in optimizing the integrated circuit design for speed, power, area, noise, etc., far beyond the capabilities possible when using only the initial library. Therefore, due to these optimizations, a new hybrid library must be generated taking into account the changes made by the optimizations discussed above. The new optimized gate schematic net list is provided along with the new hybrid library to a place and route tool.

The place and route tool then places and routes hybrid logic gates (not original/initial logic gates) according to the gate schematic net list in a two dimensional format which is compatible with mask generation and integrated circuit processing. In other words, the place and route tool uses the hybrid cells from the hybrid library in conjunction with the optimized gate schematic net list to physically place the logic cells onto an integrated circuit die in a manner which fits in the reticule mask size required in the industry. Once the physical design file is provided by the place and route tool to indicate a two dimensional layout of the integrated circuit, integrated circuit masks are formed from the physical design file information. These masks are then used to manufacture a plurality of integrated circuit wafers/dies using semiconductor processing techniques widely known in the art. Techniques used to form integrated circuits from masks can be found via "Silicon Processing For the VLSI Era", Volume 1, by S. Wolf and R. N. Tauber, Lattice Press, 1986.

Figure 3:
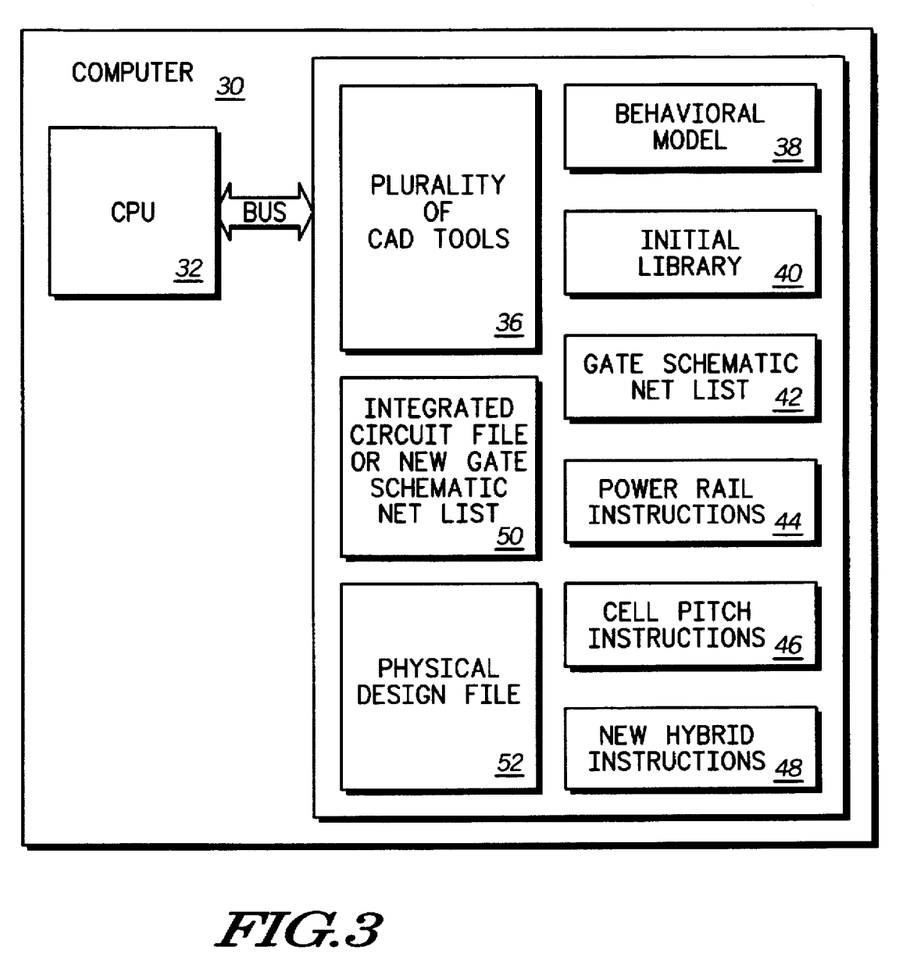
FIG. 3 illustrates, in a block diagram, a file structure used within a data processing apparatus in order to allow dynamic cell processing for IC design in accordance with the present invention.

Specifically, the above process can be performed by utilizing a file structure illustrated in FIG. 3. FIG. 3 illustrates a computer 30 having a CPU 32 coupled to a memory 34 via a bus. The bus typically passes address, data, and control information to and from the memory unit 34. In memory 34 are a plurality of computer programs for manipulating data structures/data bases and a plurality of data files. These files, computer programs, and data bases, are used by the CPU 32 to perform the operations illustrated in subsequent FIG. 4–5. Therefore, FIG. 3 will be discussed with reference to FIG. 4–5 since the two figures are closely related. FIG. 3 illustrates a plurality of CAD (computer aided design) tool programs 36 stored in memory 34. These plurality of CAD tools include automated programs for generating the library in step 106 and step 105 both of FIG. 4. CAD tools 36 also includes tools for generating the computer instructions for describing IC logical behavior used within the behavioral model 100 of FIG. 4. CAD tools 36 also includes a logic synthesis tool, such as the Synopsys® design compiler, to transform the behavioral circuit model to a gate schematic net list illustrated in FIG. 4 via the output of step 102.

The aforementioned behavioral model, initial library, gate schematic net list are illustrated in FIG. 3 as behavioral model file 38, initial library of cells data base 40, and gate schematic net list file 42. Once the CAD tools 36 process the model 38 and the library 40 to produce the gate schematic net list 42, the gate schematic net list is optimized via steps 104–114 in FIG. 4. The optimization in steps 104 and 110 can simply involve changes to the original gate schematic net list 42, the writing of a whole new gate schematic net list 50, or simple file additions or addendum files to the gate schematic net list 42. The steps 112 and 114 in FIG. 4 respectively provide power rail instructions 44 and cell pitch instructions 46 to separate data files in memory to use by the step 105 in FIG. 4. After the power rail instructions 44 and instructions 46 are formed and a new gate schematic net list 50 is generated or the gate schematic net list 42 is optimized/changed, then a new hybrid library 48 is created via steps 116–125 in FIG. 4. The new hybrid library from hereon in the process replaces the initial library 40 since the optimization of the gate schematic net list results in altering logic cells beyond the scope of the initial cells stored in the initial library.

The CAD tools 36 include a place and route program which accepts as input the new hybrid library 48 and the new optimized gate schematic net list 42 or 50 and produces a physical design file 52. The new hybrid library 48 contains separate non-connected logic cells for purposes of cell definition. Gate schematic net list 42 contains several cells from the new hybrid library 48 interconnected in order to properly form the logic function of the integrated circuit described via model 38. Physical design file 52 incorporates information from the gate schematic net list functionality using hybrid cells from library 48 in a two-dimensional layout manner which physically defines the layout structure of the integrated circuit in a two-dimensional graphical data base manner. The physical design file is the output or final file provided via the steps of FIGS. 4–5 and stored in memory 34. It is important to note that there are literally hundreds of possible file organization combinations for the steps of FIGS. 4–5. FIG. 3 is one possible combination of files among the many combinations in which file management can occur for the process of FIGS. 4–5.

Figure 4:
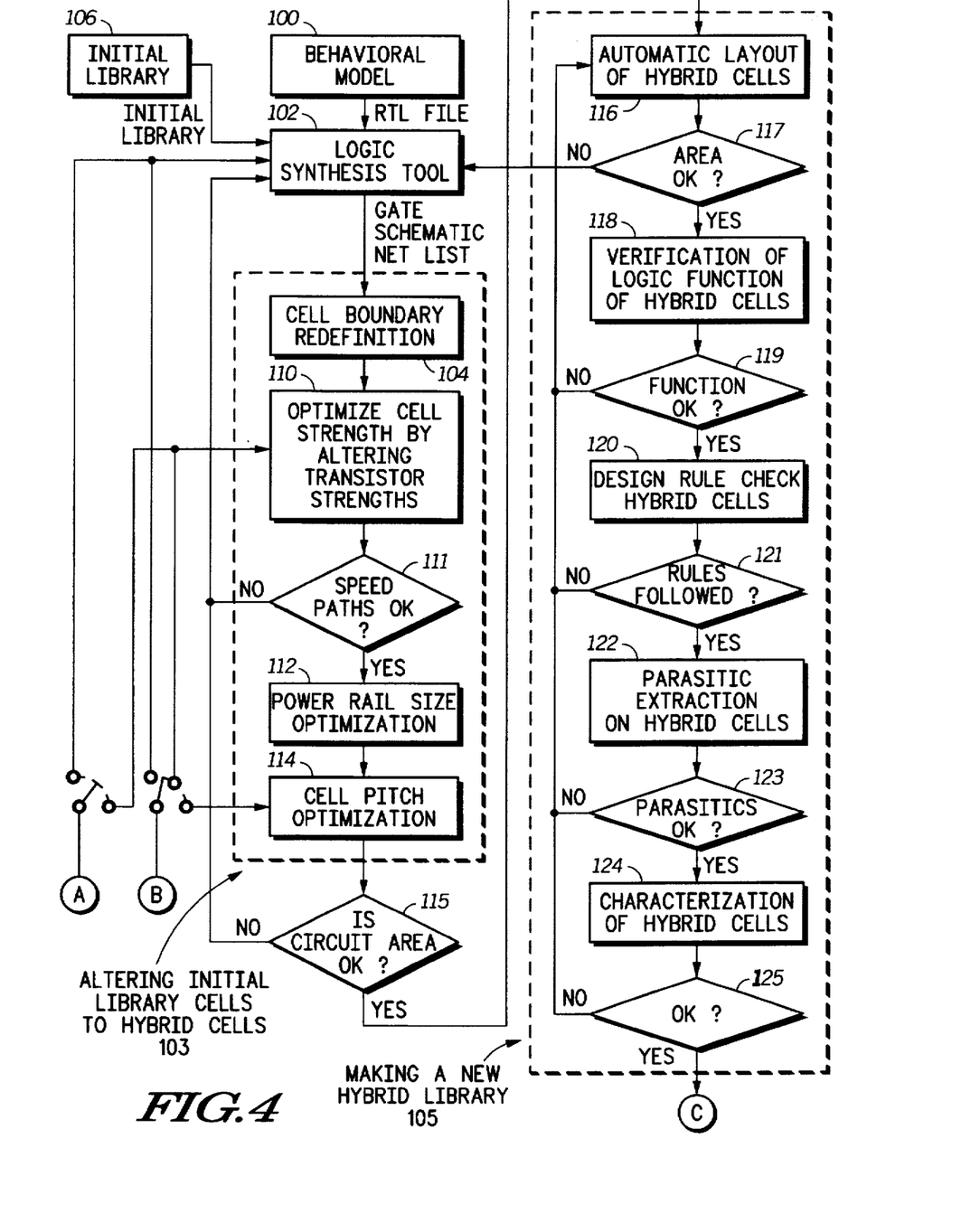
FIGS. 4–5 together illustrate, in a flowchart, a single process for designing an integrated circuit (IC) using a library cell dynamic process in accordance with the present invention.

FIG. 4 illustrates a step 100 wherein a behavioral integrated circuit model is provided. The behavioral model or register transfer logic (RTL) file contains a plurality of instructions that resemble a high-level computer language. These plurality of instructions logically define a logical operation or functional operation of an integrated circuit. A short except of a behavioral model may look like:

EXAMPLE 1

```
module      NineCell (a, b, c, d, e, f, g, x, y, z);
input       a;
input       b;
input       c;
input       d;
input       e;
input       f;
input       g;
output      x;
output      y;
output      z;
wire        x;
wire        y;
wire        z;
assign
x = c & d & e & f & g l a & c & e,
y = a & b & c & e l a & b & c & e & f & g,
z = a & c & d & e & f & g l b & f;
endmodule
``` where & is a logical AND operation, and l is a logical OR operation. The file may also include other operators describing NOR, NAND, XOR, inversion, add, subtract, multiply, divide, bit-wise operations, shift operations, and like logical operations.

FIG. 4 illustrates that a step 106 provides an initial library comprising a plurality of stored logic cells. The logic cells will contain two dimensional layouts of individual unconnected cells having inputs and outputs that when interconnected among many other library cells form an integrated circuit. For example, an initial library may contain an inverter, a two-input OR gate, a three-input OR gate, a two-input AND gate, a three-input AND gate, a two-input NOR gate, a three-input NOR gate, a two-input NAND gate, a three-input NAND gate, an XOR gate, D flip-flops of varying sizes, multiplexor blocks, tri-state buffers, output buffers, pass transistor layouts, half adder layouts, full adder layouts, and like small "building block" logical cells/ components.

In FIG. 4, a logic synthesis tool is used in step 102. The logic synthesis tool receives as input the required interconnection schemes of each library cell and the RTL file from steps 100 and 106. The step 102 transforms the logical instruction operations of the RTL file to a physical gate manifestation by replacing logical representations of the instruction in step 100 with cells/gates from step 106.

Therefore, when the step 102 determined that the RTL file contains an instruction a&b, step 102 matches a corresponding/appropriate physical AND logic gate cell from the library to perform this a&b operation. The resulting output of this correlation and interconnection to attain the functionality of the RTL file using logic gates/cells of the initial library of step 106 resulting in the a following example of a gate schematic netlist:

EXAMPLE 2

```
module NineCell (a, b, c, d, e, f, g, x, y, z);
input a, b, c, d, e, f, g;
output x, y, z;
    wire n63, n64, n65, n66, n67, n68;
    nand3 U7 {.in_0(d), .in_1(g), in_2(f), .out(n64)};
    nand2 U8 {.in_0(c), .in_1(e), .out(n65)};
    nand2 U9 {.in_0(f), .in_1(b), .out(n67)};
    nand2 U10 {.in_0(a), .in_1(b), .out(n68)};
    nor2 U11 {.in_0(n65), .in_1(n68), out(y)};
    inv U12 {.in_0(a), .out(n63)};
    or3 U4 {.in_0(n65), .in_1(n63), .in_2(n64), .out(n66)};
    nand2 U5 {.in_0(n66), .in_1(n67), .out(a)};
    aoil2 U6 {.in_00(n65), .in_10(n63), .in_11(n64), out(x)};
endmodule
```

Example 2 illustrates the output file of step 102 which is typically a text file gate schematic net list representing, in instructions, interconnected library cells. The output of both steps 100 and 102 are functionally equivalent representations although RTL files are easier for a human to generate than gate schematic netlists. Therefore, the RTL file is human generated, and transformation from an RTL file to a gate schematic net list is automated or partially automated. For information regarding gate schematic net list generation, refer to Design Compiler Tutorial Version 3.0b, June 1993, Synopsys®.

After step 102, a step 103 is performed wherein step 103 optimizes the gate schematic netlist on a transistor-by-transistor TELOS basis to improve speed at the expense of area while trying to minimize the overall area impact. The method taught herein will provide one or more of the advantages or improvement an item selected from the group of circuit speed, signal noise, power, capacitive coupling, inductance, circuit surface area, power rail sizing, cell height/pitch, cell 2-D shape, etc.. Step 103 is illustrated in FIG. 4 as several sub-steps 104, 111, 112, and 114. In order to understand these sub-steps, the FIGS. 6–9 are now discussed and FIG. 4 will be returned to later.

Figure 6:
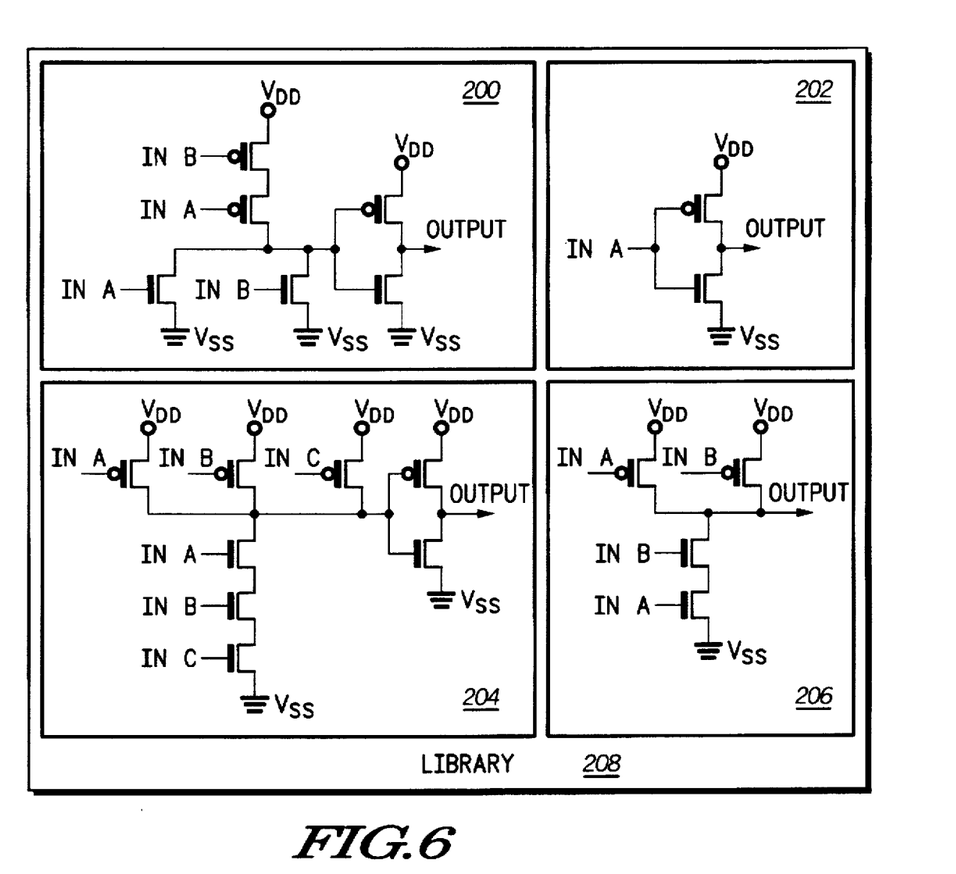
FIG. 6 illustrates a initial library which is analogous to a library produced by the step 106 of FIG. 4.

FIG. 6 illustrates a initial library 208 which is analogous to a library produced by the step 106 in FIG. 4. This library contains only four cells and is therefore extremely simplified by way of example. Most libraries out of step 106 comprise tens to hundreds of predetermined logic cells. Library 208 comprises a two-input OR gate 200, an inverter 202, a three input AND gate 204, and a two-input NAND gate 206. The two dimensional IC layouts of the cells 200, 202, 204, and 206 are stored in the library in an X-Y data format which is not graphically illustrated in FIG. 6.

Figure 7:
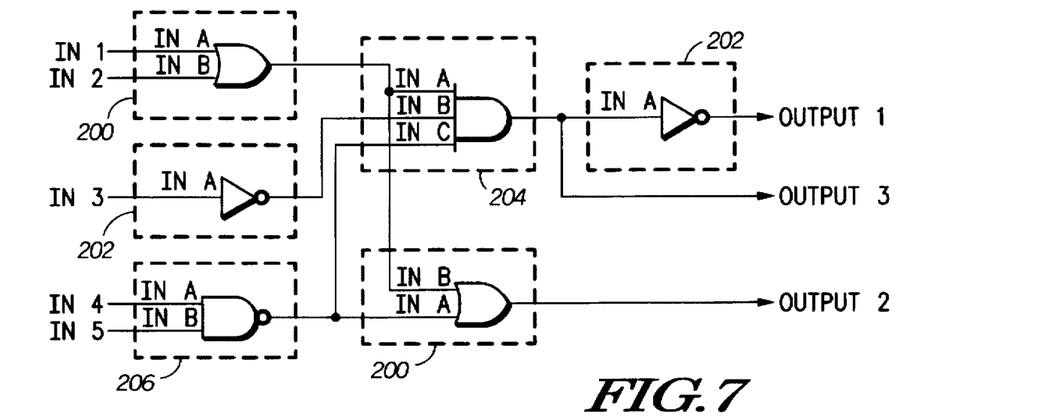
FIG. 7 illustrates graphically the textual contents of a gate schematic net list.

FIG. 7 illustrates graphically the textual contents of a gate schematic net list. The gate schematic netlist graphical representation of FIG. 7 resulted from processing a behavioral circuit model (RTL file) which textually described logically three outputs (output 1, output 2, and output 3) which are a function of five inputs (in 1, in 2, in 3, in 4, and in 5) along with a library of cells from FIG. 6.

Figure 8:
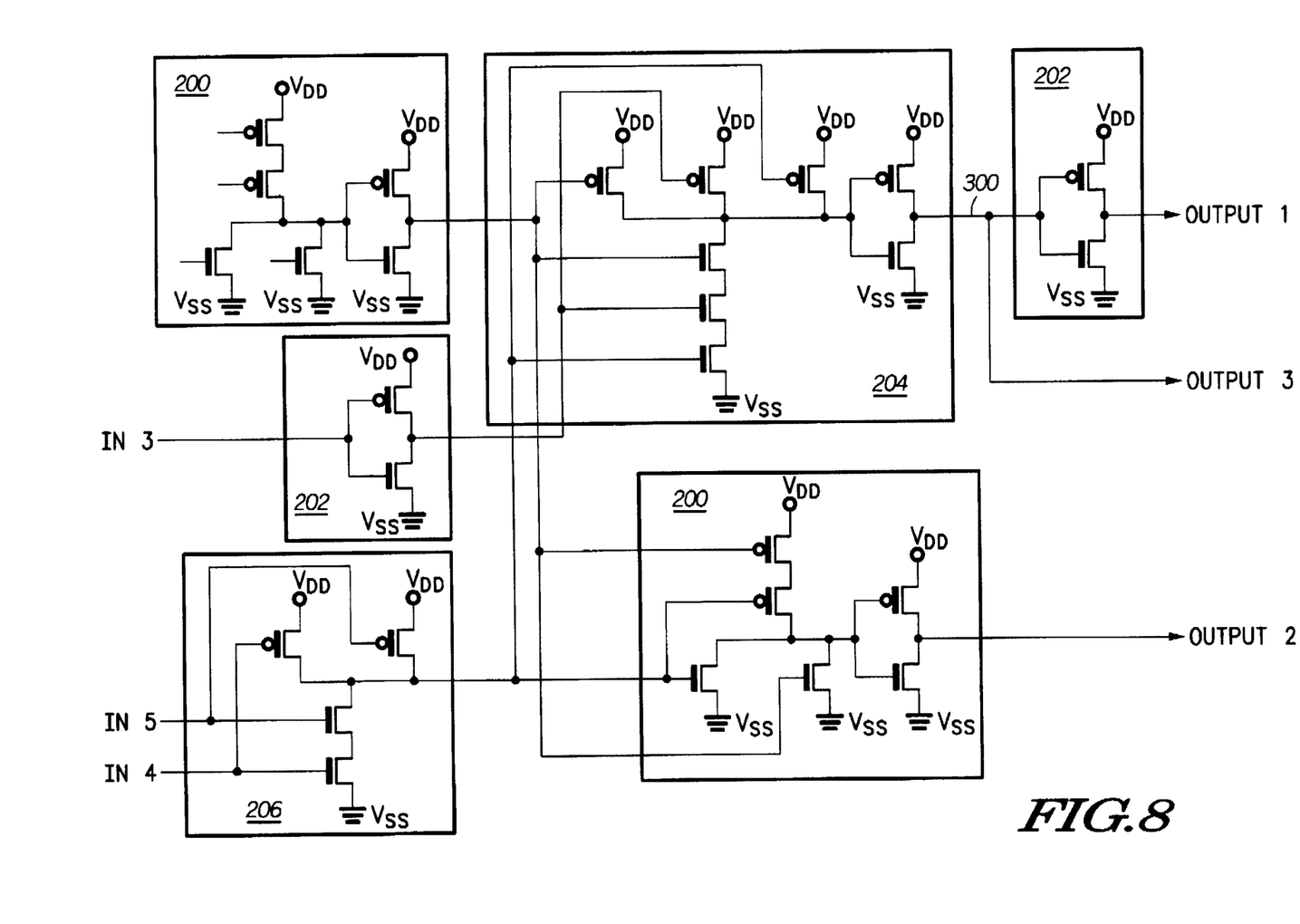

FIG. 8 illustrates a transistor level diagram of the gates of FIG. 7, and is representative of the textual data stored by a gate schematic net list provided via the step 102 in FIG. 4.

FIG. 8 illustrates the boundaries of the initial cells 200, 202, 204, and 206 as used defined in FIG. 6.

FIG. 4 illustrates that a first sub-step in step 103 is used to redefine cell boundaries within the gate schematic net list illustrated graphically by FIG. 8. It is important to note that one library cell may be used hundreds or thousands times in the gate schematic net list to arrive at a function net list. The cell boundary redefirdtion is performed as indicated by the following psuedocode where {...} are comment regions (in some embodiments, redefinition of boundaries may not be needed):

```
definitions:
    cost( );    {determines the impact a specific cell or many cells
                have in terms of area, delay, power, etc.}
    glom (x,y)  {generates one or more hybrid cells from an x
                initial cell and a y initial cell}
code:
begin;
input gate level netlist;
    C=cost(all gates in net list);    {determine the initial cost of
                                      the gate schematic netlist as
    do                                output from step 102}
        do
            choose x, y such that
                cost(glom(x,y)) is minimal;  {go through pairs of
                                             adjacently coupled gates and
                                             attempt to change their
                                             boundaries to find a minimal
                                             impact cell boundary
                                             configuration}
            if cost (glom(x,y)) < cost (X) + cost(y)
                then replace x and y with    {if the use of the hybrid
                    glom (x,y);              cells is better than the use of
                                             the individual x and y original
                                             cells then use the hybrid
                                             cells}
            C=cost(all gates with newly      {get a new C value due to
            added hybrid cells)              the new hybrid improve-
                                             ments}
        for all designated gate pairs in design {do loop over all adjacent
                                                gate pairs which require
                                                optimization of boundaries}
    until (C does not decrease);    {loop until no more benefit is
                                    attained by hybrid boundary
                                    redefinition}
output a hybrid improved gate schematic net list;
end;
```

Figure 9:
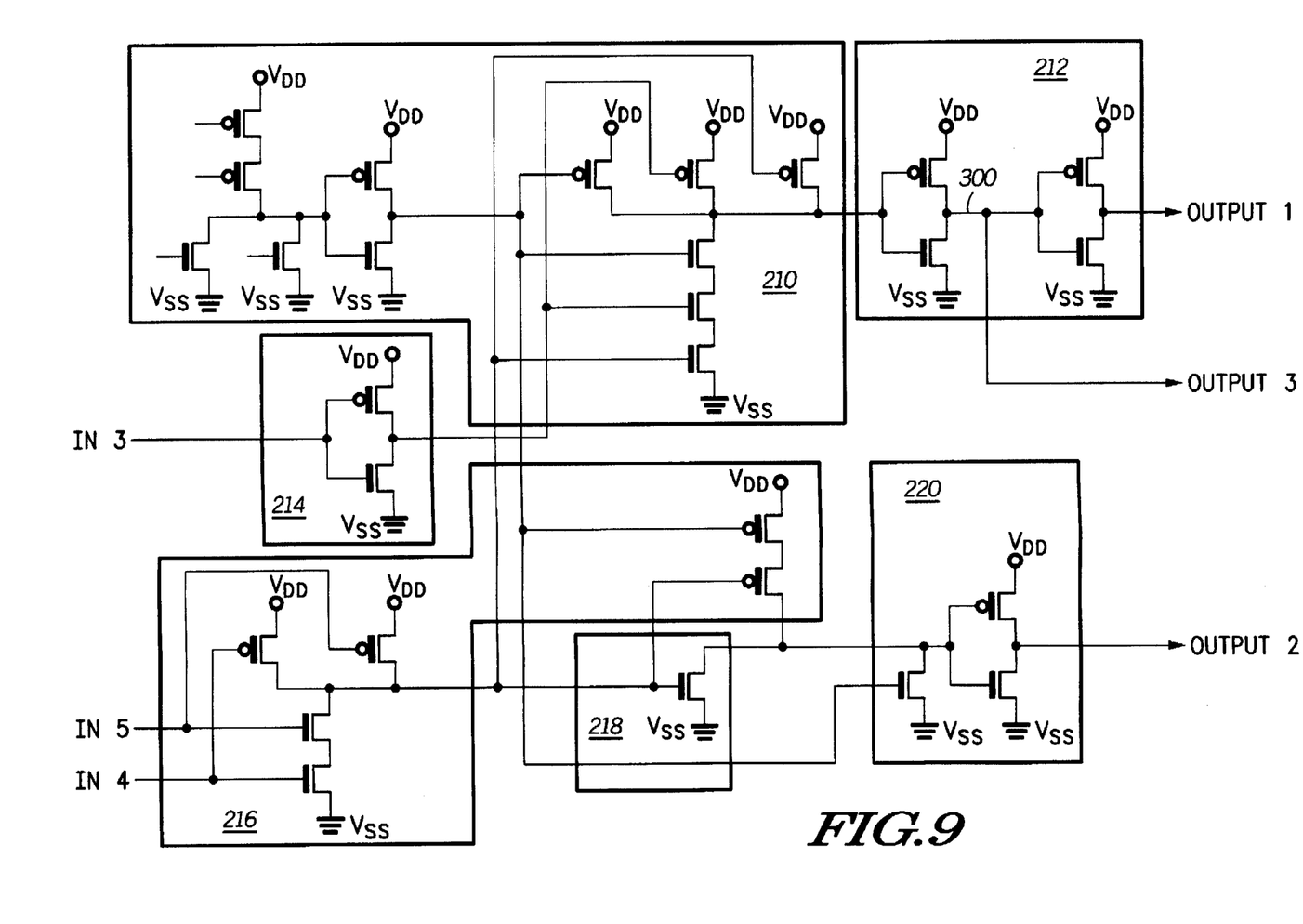
FIG. 9 illustrates alternate gate boundaries for the transistor level diagram of FIG. 8.

In general, the gate boundary redefinition is illustrated in FIG. 9 when compared to FIG. 8. Gate boundary redefinition may have freedom to change boundaries on a transistor by transistor basis or may only be allowed to combine whole initial cells in new/larger boundary patterns. In FIG. 9, the output inverter of 204 is combined with inverter 202 of output 202 to form a dual inverter hybrid cell 212 with two outputs. Hybrid cell 210 illustrates that two gates (a 3-input NAND and a two input OR) may be combined to form a hybrid cell 210. FIG. 9 also illustrates that a minimum impact cell is equal to the initial cell. In other words, the cell 202 and the hybrid cell 214 are the same between FIGS. 8 and 9. Hybrid cell 216 in FIG. 9 illustrates that initial cells may be split in a transistor-by-transistor basis to form hybrid logic cells. Hybrid logic cell 218 illustrates that a single transistor may be a cell, and hybrid cell 220 teaches that a hybrid cell can be a portion of an initial or previous cell.

With the exception of hybrid cell 214, the hybrid cells of FIG. 9 are not located in the library of FIG. 6. Therefore a new library must be generated to manufacture ICs using the hybrid logic cells. In addition, other areas of the IC or circuit block may use the initial cells the library of FIG. 6. Therefore, the new hybrid library of cells will usually contain more cells than the initial library cells although, in some seldom-occurring situations, a hybrid library will have fewer cells than the initial library. For example, the hybrid library may need to contain cells 200, 204, 202, 206, 210, 212, 214, 216, 218, and 220 in order to make the IC. Due to the typical resulting volume of different hybrid cells that result, the hybrid library layout generation is typically entirely automated via software since a human-created hybrid library would take too many man hours to create.

The redefinition of cell boundaries is useful for many reasons. By redefining cell boundaries according to one or more predetermined cost criterions (speed, power, area, noise, etc.), a better design can be made. For example, assume that the signal conductor 300 in FIG. 8 is on a critical speed path and that region 300 must be short in conductive length and fast. The redefinition of the upper right-hand cells 204 and 202 in FIG. 8 to hybrid cell 212 in FIG. 9 ensures that line 300 will be small and fast since the two inverters of cell 212 are now ensured to be placed close together. In fact, the cells will be placed directly adjacent one another. Redistributed boundaries may help cell shape and cell area leading to a more dense layout. Also, combining transistor of same conductivity type may result in a more well-efficient layouts result wherein a well is a doped region within the substrate where different dopant-type wells are needed for PMOS transistors versus NMOS transistors.

Therefore, the above discussion describes in detail the function of the step 104 in FIG. 4. The redistribution of cells have numerous advantages.

After the re-defining of the cell boundaries in step 104, a step 110 is performed. In step 100, individual cell transistors are increased and/or decreased in size to modify a channel region size or aspect ratio (Width/Length of the gate electrode/channel region) of the transistor in order to provide a circuit that is in accordance with provided/predetermined speed requirements. Each circuit has speed paths or delay times wherein a signal must travel from point A to point B in an integrated circuit. In an integrated circuit, a specification determines that path A to path B must be traversed in X nanoseconds. By sizing gate electrodes/channel regions of transistors over the circuit path from A to B, one can get the speed of transmission to less than or equal to X.

Step 100 is performed via a TILOS, or a like, sizing scheme described via one or more of: "A set of switch-level synthesis tools", by Hill, D. D., Shugard, D., Dunlop, A., Fishburn, J, 1990 IEEE International Symposium on Circuits and Systems, p.2571-5 vol.4; "Experiments using automatic physical design techniques for optimizing circuit performance", Dunlop, A. E., Fishburn, J. P., Hill, D. D., Shugard, D. D., 1990 IEEE International Symposium on Circuits and Systems, p.847–51 vol. 2; "Optimization-based transistor sizing", Shyu, J., Fishburn, J. P., Dunlop, A. E., Sungiovanni-Vincentelli, A. L., Proceedings of the IEEE 1987 Custom Integrated Circuits Conference p.417–20.

Once step 110 is complete, a step 111 checks to ensure that all speed paths are within specification. If a speed path timing problem is too severe to be acceptable, the step 102 is re-performed and a new gate schematic net list is derived. Many of these feedback paths exist in FIGS. 4–5 and are used to "back-up" and optimize when conditions warrant.

If the speed paths are within predetermined timing constraints, then a step 112 is performed. After step 110, a determination can be made regarding the power that will be needed by the integrated circuit in order to function properly. This power can be related to current flow through P=IV where P=maxmal power over time, I=max current drawn by IC over time, V=voltage supplied when max current drawn.

The current I can be used to determine the cross-sectional area required for the metal lines that provide Vdd and ground to the IC. Typically, the depth or height of the wire is process dependent and fixed whereas the lithographic width of the metal power rail lines can be altered by design. The widths of the power rail are adjusted to ensure that the metal will not current limit or fail when the IC requires maximal power consumption. Power rail sizing can be optionally during place and route to adjust power rail sizing by IC row or block. Typically an IC is laid out in circuit blocks or rows which comprise the total IC. These blocks or rows may each have varying power requirements that do not need the maximal power rail sizing determined above.

Once step 112 is performed, a step 114 is performed. Step 114 is used to optimize cell pitch (i.e., cell height) to allow the IC circuit block to fit into a predetermined space/shape or to reduce the total area of the circuit block. Each cell in a block is given the same pitch for block uniformity and a change in height can affect width. A change in cell pitch may either increase or decrease total cell area, therefore, a search over a range of cell pitches is used to minimize the total area. One cell pitch process is as follows:

```
Input:
    maxH;           {maximal allowable cell height}
    minH;           {minimal allowable cell height}
    deltaH;         {cell height quantized step size}
    gate schematic netlist data;
    cell area weights;  {the number of times a cell is used within IC}
Output:
    bestH;          {optimal height value}
begin
    H = best H = max H;  {set H and best H to the maximal
                          possible}
    do
        generate cell library/circuitry at height H via netlist info;
        if total area is smaller than bestH then bestH = H;
        H=H–deltaH;
    while (H>=minH);
end;
```

The bestH value that is output from the above method is the optimized value for the cell, IC, or block of cells. In another form, a space/shape may be predetermined and the block of cells may only need to be optimized and/or confined within the predetermined space/shape.

After step 114, a step 115 is performed. In step 115, the area of the gate schematic netlist file optimized via step 103 is analyzed to ensure that the area is acceptable. If the total area is not acceptable, the method returns to step 102.

After the step 103 (which includes steps 104, 110, 111, 112, and 114), some cells of the initial library of step 106 will probably not resemble any cells resulting out of step 115. The integrated circuit file output from step 115 contains hybrid cells which may vary from initial cells by one or more of: boundaries, cell strength (transistor sizing), cell pitch, power rail width, and the like. For these reasons, the hybrid cells in the integrated circuit file, which is provided out from step 115, must be used to create a new library via a step 105. Step 105 contains sub-steps 116, 117, 118, 119, 120, 121, 122, 123, 124, and 125.

In the step 116, the hybrid cells are automatically assigned to an optimal 2-D area via an automated layout tool. Layout of library cells can be performed by hand by a designer but the sheer volume of cells that typically results out of the step 115 results in an automated process being of great time saving value. Automated cell layout for a library can be performed by canned software such as Cadence® design tools like the Virtuoso Layout Synthesize™. Automated layout is taught via "Optimal Layout of CMOS Functional Arrays", IEEE Tran. Computer, Vol. C-30, pp. 305–312, May 1981; "GENAC: an automated cell synthesis tool", Ong, Proc. 26th Design Automation Conference, pp. 474–479; and "LIB: a cell layout generator", Proc. 27th Design Automation Conf., pp. 474–479, 1990.

After step 116, a step 117 checks to ensure that the area of the hybrid library cells is satisfactory and if not, the method returns to step 102. If step 117 determines that the area of the hybrid cells is acceptable then the step 118 is executed.

Step 118 is used to verify the logical operation of the laid-out hybrid cells. This step 118 asks the question, "does the layout in step 118 perform the same logical operation the hybrid gates input to step 116?" In a few cases, an automated layout tool or an automated layout optimized slightly by human input can produce a flaw in a logic cell layout. These logical/operational flaws can be found in step 118. If errors are found in step 118, a step 119 re-routes the process back to step 116 so that flaws can be corrected.

In a step 120, the design rules of the hybrid cells are checked. Design rules are rules that limit metal spacing, doped well separation, contact geometries, field isolation minimum widths, closeness of conductive layers, pitch of layers, minimum lithographic dimensions for layers, and the like. The design rules are rules that are usually built up over time and learned by experience. These rules are implemented to avoid structural formation that tend to fail, reduce yield, leakage current, create undue, capacitance, increase detrimental electric field and breakdown of oxides, and the like. If the hybrid cells in the hybrid library are in accordance with the design rules a step 122 is performed else the step 116 is returned to.

In step 122, parasitic parameters are extracted from the cell layout created in step 116. Step 122 determines capacitance, resistance, inductance, and other SPICE-like parameters needed to understand the physics operation of the cell. These parasitic parameters aid in cell characterization and aid in improving or optimizing the library cells. If, in step 123, the parasitics indicate an error, step 116 is returned to, else a step 124 is performed.

In the step 124, the hybrid cells are characterized. Characterization means that the cells are analyzed to define circuit operation parameters such as rise times, fall times, propagation delays, skew, and the like. If characterization via the step 124 indicates an acceptable plurality of hybrid cells, then the step 126 of FIG. 5 is performed, else the step 116 is returned to.

Figure 5:
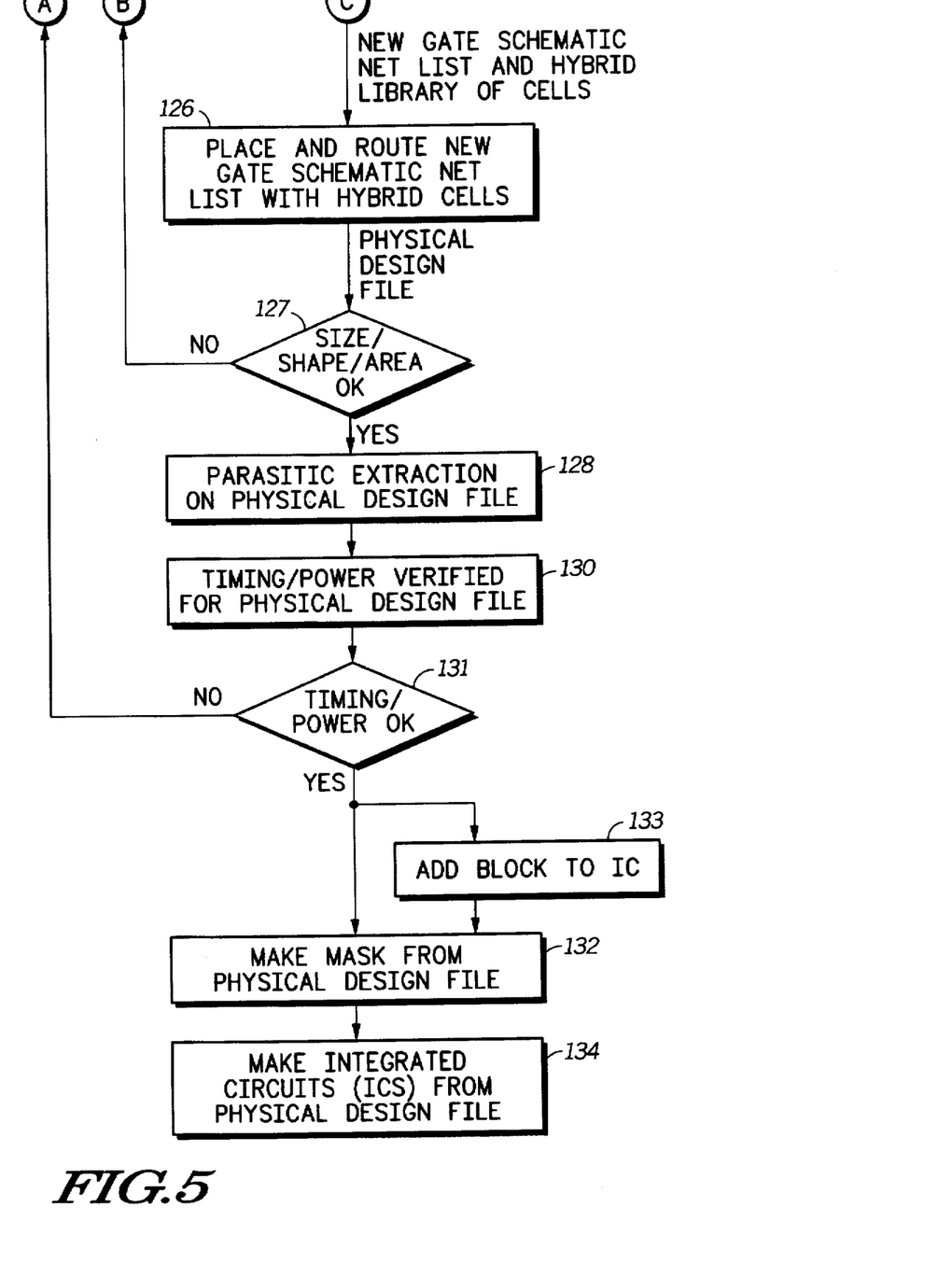

In FIG. 5, a step 126 receives as input the gate schematic net list with all optimizations/changes from step 103 and receives as input the hybrid cells of the hybrid library. From the gate schematic net list and the hybrid cells, the place and route tool lays out the circuit hybrid cells, groups of hybrid cells, and/or portions of the IC to form a larger 2-dimensional (2-D) physical layout file of the circuit described behaviorally via step 100. This larger 2-D circuit may be an entire IC or a portion of yet another larger IC. In general, the net list contains information regarding what cells are connected to what other cells without defining cell arrangement on a 2-D surface and the hybrid library contains detailed 2-D layouts for each cell with no interconnectivity information. By combining the two and interconnecting the cells using conductive interconnects, the step 126 outputs a physical design file that is a 2-D computer graphical database for the physical die of the IC. Place and route tools are available from ArcSys®, and one such tool is ArcCell™. In practice, although referred to as 2-D for simplicities sake, the physical design file contains a plurality of stacked 2-D layers to create a three-dimensional (3-D) data base that describes the actual physical structure of the manufactured IC. For example, the physical design file will contain a 2-D layer for source and drain regions of transistors, a 2-D layer for gate electrode placement, several 2-D layers for interconnection layers of metal and polysilicon, 2-D threshold and field oxide implant regions, layers for contacts openings to connects interconnection layers to one another, and the like.

In a step 127, if the place and route tools results in an unsatisfactory 2-D IC layout, then the choice is made to return to one of either steps 114, 110, or 102 depending upon the severity or type of problem. If the physical design file output from step 126 is within expectations, then the step 128 is performed to extract parasitic information for the entire physical design file. Step 128 is similar to step 122 with only the sheer volume of circuitry analyzed being different.

In a step 130, the timing and power of the physical design file is verified. If the circuit timing and power consumption is within accpetable limits then the step 131 directs the method to one of either step 133 or step 132, else one of either the steps 102 or 110 are returned to. If, in steps 131, the entire IC is completely pieced together the step 132 is directly executed. If the processing of steps 100–130 were simply to create a block of a larger circuit, then step 133 incorporates all blocks together to create a complete IC and then the step 132 is executed.

In step 132, several IC masks are made in accordance with the physical design file. Typically, one mask is equivalent to one layer in the 3-D structure of the physical design file. Layers in the physical design file, and therefore masks, may vary from design-to-design from 5 or so masks to roughly one hundred masks. These masks are each physical replicas of the 2-D layers in the computer-stored physical design file. Masks are made by exposing photoresist covered quartz substrates (that have a thin upper layer of an opaque material) to a light pattern determined by reading data from the physical design file. E beam traces guided by the physical design file database or directionless light focused by small openings created by an X set of blades and a Y set of blades expose only portions of the photoresist on the quartz masks. The mask is then selectively etched to form opaque and transparent regions in accordance with a layer in the physical design file.

In a step 134, the masks are used in a lithographic process to form a plurality of ICs. IC fabrication techniques are known in the art as taught by "Silicon Processing", S. Wolf, Vol. 1, Lattice Press, 1986.

While the present invention has been illustrated and described with reference to specific embodiments, further modifications and improvements will occur to those skilled in the art. For example, further feedback paths can be added to the flow of FIGS. 4–5 as needed to optimize a design process. Many different file structures and databases exist to implement the process of FIGS. 4–5. Plurality as used herein is intended to mean any integer between 2 and infinity and should not be limited to any other sub-range or constant. It is to be understood, therefore, that this invention is not limited to the particular forms illustrated and that it is intended in the appended claims to cover all modifications that do not depart from the spirit and scope of this invention.

What is claimed is:

1. A method for generating an integrated circuit file, the method comprising the steps of:

providing a predetermined library containing a predetermined plurality of logic cells;

providing a behavior model which comprises a logical description of the functionality of the integrated circuit;

using the behavior model and the predetermined library to generate a gate schematic net list of the integrated circuit where the gate schematic net list contains various logic cells from the predetermined library;

altering the various logic cells in size to create hybrid logic gates in order to optimize the gate schematic net list; and creating a new library of hybrid logic cells from the gate schematic net list and using these new hybrid logic cells to generate the integrated circuit file in accordance with the gate schematic net list.

2. The method of claim 1 further comprising the step of:

providing the integrated circuit file to a place and route tool which will provide a data file containing two dimensional layout data for an integrated circuit in accordance with the integrated circuit file.

3. The method of claim 2 wherein the step of providing the integrated circuit file to a place and route tool further comprises:

generating masks from the data file wherein the masks contain opaque and clear regions in accordance with the two dimensional layout data of the data file.

4. The method of claim 2 wherein the providing the integrated circuit file to a place and route tool further comprises:

manufacturing a plurality of integrated circuits, each integrated circuit in the plurality of integrated circuits having a layout in accordance with the data file.

5. The method of claim 1 wherein the step of creating a new library of hybrid logic cells from the gate schematic net list further comprises:

determining which physical divisions of the gate schematic net list provide an appropriate number of new hybrid logic cells;

optimizing gate sizes of transistors within the new hybrid logic cells to optimize an operational speed of the gate schematic net list; and generating the integrated circuit file in accordance with the gate schematic net list which now has optimized gate sizes.

6. The method of claim 5 wherein the step of optimizing gate sizes further comprise:

using a TILOS method of gate sizing to optimize the new hybrid logic cells in order to both: (1) minimize time delays through circuits until the time delays are within specified limits; and (2) obtain an adequate layout size for the gate schematic net list.

7. The method of claim 5 wherein the step of creating a new library of hybrid logic cells from the gate schematic net list further comprises:

providing the integrated circuit file to a place and route tool to create a two-dimensional layout database in accordance with the gate schematic net list.

8. The method of claim 7 wherein the step of providing the integrated circuit file to a place and route tool further comprises:

returning to the step of optimizing gate sizes of transistors within the new hybrid logic cells to re-optimize the gate sizes when the two-dimensional layout database is not operating within specifications.

9. The method of claim 1 wherein the step of creating a new library of hybrid logic cells from the gate schematic net list further comprises:

determining which physical divisions of the gate schematic net list provide an appropriate number of new hybrid logic cells;

optimizing conductor widths of conductors which supply a power supply voltage and a ground supply voltage to the new hybrid logic cells; and generating the integrated circuit file in accordance with the gate schematic net list which now has optimized power rail sizing.

10. The method of claim 1 wherein the step of creating a new library of hybrid logic cells from the gate schematic net list further comprises:

determining which physical divisions of the gate schematic net list provide an appropriate number of new hybrid logic cells;

optimizing a cell pitch for each hybrid logic gate; and generating the integrated circuit file in accordance with the gate schematic net list which now has optimized cell pitch.

11. The method of claim 1 wherein the step of creating a new library of hybrid logic cells from the gate schematic net list further comprises:

determining which physical divisions of the gate schematic net list provide an appropriate number of new hybrid logic cells;

optimizing gate sizes of transistors within the new hybrid logic cells to optimize an operational speed of the gate schematic net list;

optimizing conductor widths of conductors which supply a power supply voltage and a ground supply voltage to the new hybrid logic cells;

optimizing a cell pitch for each hybrid logic gate; and generating the integrated circuit file in accordance with the gate schematic net list which now has been optimized.

12. The method of claim 11 wherein the step of creating a new library of hybrid logic cells from the gate schematic net list further comprises:

providing the integrated circuit file to a place and route tool to create a two-dimensional layout database in accordance with the gate schematic net list.

13. The method of claim 12 wherein the step of providing the gate schematic net list to a place and route tool further comprises:

returning to the step of optimizing gate sizes of transistors within the new hybrid logic cells to re-optimize the gate sizes when the two-dimensional layout database is not operating within specifications.

14. The method of claim 1 wherein the step of creating a new library of hybrid logic cells from the gate schematic net list comprises:

forming the new library having N hybrid logic cells whereas the predetermined library has M logic cells, N being greater than M.

15. The method of claim 1 wherein the step of creating a new library of hybrid logic cells from the gate schematic net list comprises:

determining which physical divisions of the gate schematic net list provide an appropriate number of new hybrid logic cells;

generating layouts for each new hybrid logic cell;

verifying the layouts of the new hybrid logic cells to ensure that they are in accordance with the new hybrid logic cells of the gate schematic net list;

verifying that the layouts of the new hybrid logic cells are within predetermined design rule specifications;

extracting parasitic parameters from the layouts of the new hybrid logic cells; and characterizing the layouts of the new hybrid logic cells for at least one of: power, delay time, area, rise time, fall time, and noise.

16. The method of claim 15 wherein the steps of generating layouts for each new hybrid logic cell, verifying the layouts of the new hybrid logic cells, verifying that the layouts of the new hybrid logic cells are within predetermined design rule specifications, extracting parasitic parameters, and characterizing the layouts comprise:

performing all the steps of generating layouts for each new hybrid logic cell, verifying the layouts of the new hybrid logic cells, verifying that the layouts of the new hybrid logic cells are within predetermined design role specifications, extracting parasitic parameters, and characterizing the layouts in a fully automated manner through the use of automated tools.

17. A method for making a plurality of integrated circuits, the method comprising the steps of:

providing a behavior model representing the functional operation of each of the integrated circuits in the plurality of integrated circuits;

providing an initial library of logic cells;

using the logic cells of the initial library and the functional operation within the behavioral model to generate a logic gate representation of each of the integrated circuits in the plurality of integrated circuits;

modifying the logic gate representation to generate a new logic gate representation;

generating a new library of logic cells from the contents of the new logic gate representation;

generating a physical design file from the new library of logic cells, the physical design file being a description of a physical integrated circuit having substantially the functional operation of the behavioral model; and making the plurality of integrated circuits in accordance with the physical design file.

18. The method of claim 17 wherein the step of modifying the logic gate representation to generate a new logic gate representation further comprises:

optimizing gate sizes of transistors within the logic gate representation to produce the new logic gate representation which has optimized operational speed that improves upon the logic gate representation.

19. The method of claim 18 wherein the step of generating a physical design file further comprises:

returning to the step of optimizing gate sizes of transistors to re-define gate sizes of the logic cells when the physical design file is not operating within specifications required for the plurality of integrated circuits.

20. The method of claim 19 wherein the step of generating a physical design file further comprises:

returning to the step of optimizing gate sizes of transistors within the new hybrid logic cells to re-define gate sizes of the logic cells when the physical design file is not operating within specifications required for the integrated circuits in the plurality of integrated circuits.

21. The method of claim 17 wherein the step of generating the new library comprises:

determining which physical divisions of the new logic gate representation provide an appropriate number of new hybrid logic cells from the new logic gate representation wherein the initial library contains N logic cells and the new library contains M new hybrid library cells wherein M>N.

22. The method of claim 17 wherein the step of generating a physical design file further comprises:

returning to the step of generating a new library of logic cells to re-define parameters of the logic cells when the physical design file is not operating within specifications required for the plurality of integrated circuits.

23. The method of claim 17 wherein the step of modifying the logic gate representation further comprises:

optimizing conductor widths of conductors which supply a power supply voltage and a ground supply voltage to the logic gate representation.

24. The method of claim 17 wherein the step of modifying the logic gate representation further comprises:

optimizing a cell height for each gate in the logic gate representation.

25. A design generator for generating an integrated circuit file which contains data which allows an integrated circuit to be manufactured, the design generator comprising:

means for receiving cell data from a predetermined library which contains a predetermined plurality of logic cells;

means for receiving behavioral data from a behavior model which comprises a logical description of the functionality of the integrated circuit;

means for using the behavior data and the cell data to generate a gate schematic net list of the integrated circuit where the gate schematic net list contains the cell data;

means for altering the cell data within the gate schematic net list to create hybrid cell data within the gate schematic net list in order to optimize the gate schematic net list;

means for creating a new library of logic cells from the hybrid cell data within the gate schematic net list; and means for using the new library to generate the integrated circuit file in accordance with the gate schematic net list.

26. The design generator of claim 25 wherein the means for altering the cell data changes transistor gate sizes of logic cells defined by the cell data to produce the hybrid cell data.

27. The design generator of claim 25 wherein the means for altering the cell data changes a width of conductors defined within the cell data, the conductors being used to provide a power supply signal and a ground supply signal to various cells defined by the cell data.

28. The design generator of claim 25 wherein the means for altering the cell data changes a pitch of logic cells defined within the cell data to create the new hybrid cell data.

29. The design generator of claim 25 further comprising:

means for providing the integrated circuit file in a form which can be used to create integrated circuit masks, the integrated circuit masks being subsequently used to produce a plurality of integrated circuits.

30. The design generator of claim 25 wherein a plurality of integrated circuits are formed in accordance with the integrated circuit file.

31. The design generator of claim 25 wherein the means for creating a new library: (1) determines which physical divisions of the gate schematic net list provide an appropriate number of new hybrid logic cells; (2) generates layouts for each new hybrid logic cell; (3) verifies the layouts of the new hybrid logic cells used to form the integrated circuit file to ensure that the layouts are in accordance with the new hybrid logic cells of the gate schematic net list; (4) verifies that the layouts of the new hybrid logic cells are within predetermined design rule specifications; (5) extracts parasitic parameters from the layouts of the new hybrid logic cells; and (6) characterizes the layouts of the new hybrid logic cells for a purpose of defining at least one of: power, delay time, area, rise time, fall time, and noise for the hybrid logic cells.

32. A design generator for generating an integrated circuit file for an integrated circuit, the design generator being stored via storage media and comprising:

a first storage region within the storage media for storing a first plurality of binary values, the first plurality of binary values controlling receipt of cell data from a predetermined library which contains a predetermined plurality of logic cells;

a second storage region within the storage media for storing a second plurality of binary values, the second plurality of binary values controlling receipt of behavioral data from a behavior model which comprises a logical description of the functionality of the integrated circuit;

a third storage region within the storage media for storing a third plurality of binary values, the third plurality of binary values controlling a use of the behavior data and the cell data to generate a gate schematic net list of the integrated circuit where the gate schematic net list contains the cell data;

a fourth storage region within the storage media for storing a fourth plurality of binary values, the fourth plurality of binary values controlling an altering of the cell data within the gate schematic net list to create hybrid cell data within the gate schematic net list in order to optimize the gate schematic net list; and a fifth storage region within the storage media for storing a fifth plurality of binary values, the fifth plurality of binary values allowing creation of a new library of logic cells from the hybrid cell data within the gate schematic net list and using this new library of logic cells to generate the integrated circuit file in accordance with the behavioral model.

33. A method for creating a library of logic cells, the method comprising the steps of:

scanning a gate netlist of an integrated circuit to determine a plurality of logic gates needed within the library of logic cells;

placing and routing each logic gate in the plurality of logic gates to form a plurality of logic cells, the placing and routing performed automatically by place and route automated process;

logically verifying each logic cell in the plurality of logic cells to ensure that the logic cells in the plurality of logic cells are logically equivalent to corresponding logic gates in the plurality of logic gates, the logically verifying being performed by an automated verification process;

verifying design rule constraints of each logic cell in the plurality of logic cells via an automated design rule checker;

extracting parasitic parameters from each logic cell in the plurality of logic cells via an automated parameter extractor;

extracting characterization data from each logic cell in the plurality of logic cells, the extracting being performed via an automated characterization process; and placing and routing the plurality of logic cells from the library of logic cells in accordance with the gate netlist to create a layout file.

34. The method of claim 33 wherein the steps of the method are used to create an initial library of logic cells which is used along with a behavior circuit model to generate a gate schematic net list containing data which describes the operation of an integrated circuit.

35. The method of claim 34 wherein a plurality of integrated circuits are manufactured from information defined by the layout file.

36. The method of claim 33 wherein the steps of the method are used to create an hybrid library of logic cells from a gate schematic net list containing data which describes the operation of an integrated circuit.

37. The method of claim 36 wherein the hybrid library and the gate schematic net list are used to create a physical design file containing a two-dimensional layout of the integrated circuit.

38. The method of claim 37 wherein a plurality of integrated circuits are formed in accordance with the two-dimensional layout.

39. A method for determining logic cell boundaries when provided with a behavioral model of an integrated circuit, the method comprising the steps of:

providing the behavioral model containing a first logic library cell and a second logic library cell, the first logic library cell comprising a first logic gate and a second logic gate while the second logic library cell comprises a third logic gate where the first, second, and third logic gates are physically separated logic gates;

creating a new library of logic cells from the behavioral model wherein the new library contains a first hybrid logic cell that comprises the first logic gate and a second hybrid logic cell that comprises the second and third logic gate; and using the new library of logic cells to create a two-dimensional data file of the integrated circuit containing the first and second hybrid logic cells to respectively replace the first and second logic library cells.

40. A method for placing a circuit on an integrated circuit layout, the method comprising the steps of:

generating a net list from a logic cell library and a behavioral circuit model, wherein the behavioral circuit model defines functionality of the circuit;

redefining a boundary of at least one logic cell of the logic cell library based on the net list and logic cell coupling to produce a redefined logic cell library; and placing the circuit in a two-dimensional layout based on the net list and the redefined logic cell library.

* * * * *